United States Patent [19]

Yu

[11] 3,835,457

[45] Sept. 10, 1974

[54] DYNAMIC MOS TTL COMPATIBLE

[75] Inventor: Robert Tapei Yu, Tempe, Ariz.

[73] Assignee: Motorola, Inc., Franklin Park, Ill.

[22] Filed: Dec. 7, 1972

[21] Appl. No.: 312,999

[52] U.S. Cl. .............................. 340/173 R, 307/238

[51] Int. Cl. .............................. G11c 11/40

[58] Field of Search...... 340/172.5, 173 R; 307/238, 307/239

[56] References Cited

UNITED STATES PATENTS 3,757,310 9/1973 Croxon .............................. 340/172.5

*Primary Examiner*—Terrell W. Fears

*Attorney, Agent, or Firm*—Vincent J. Rauner; Charles R. Hoffman

[57] ABSTRACT

The dynamic MOS TTL compatible input voltage level translator has an input terminal for receiving a TTL voltage level for transmission to the gate of a load MOSFET through a transmission gate MOSFET. The gate of the transmission gate MOSFET is connected to a switching bias circuit which turns on the transmission gate MOSFET to transmit the TTL input voltage, and turns off the MOSFET to maintain a voltage comprising the TTL voltage plus a bootstrap voltage at the gate of the load MOSFET. The bootstrap voltage is added through the use of an enhancement capacitor which is connected between the gate and the drain of the MOSFET load device, the drain also being connected to an input for receiving a clock complement signal. A switch MOSFET device has its gate connected through a terminal for receiving a clock signal and has its drain connected at a junction to the source of the load MOSFET device, the junction providing an output signal of a MOS amplitude voltage for application to succeeding MOS stages.

10 Claims, 2 Drawing Figures

DYNAMIC MOS TTL COMPATIBLE

BACKGROUND OF THE INVENTION

1. Field of the Invention

The invention relates to MOS field-effect transistor input buffer circuits for translating low voltage logic levels from bipolar logic circuits into high voltage logic output signals which are connected to other MOS circuits on the same monolithic chip. The invention more specifically relates to voltage level translators of the type described in which an enhanced MOS feedback capacitance which is a function of the low voltage input logic level is utilized to provide conditional boosting or bootstrapping of the low voltage logic level to a high voltage level.

2. Description of the Prior Art

Since conventional bipolar integrated circuit logic circuits operate at low voltage logic levels (for example, the typical worst-case 1 level for a TTL gate is 2.4 volts) and MOS integrated circuits typically operate at logic voltage levels of the order of 15 volts efficiently, in order to drive MOS circuits with conventional bipolar circuits, it is necessary to provide voltage level translating circuits on the MOS integrated circuit chip capable of converting bipolar logic levels to MOS logic levels. Since the threshold voltage $V_{TH}$ of MOS transistors used in MOS integrated circuits is relatively low (typically 1.5 to 2.5 volts), the problem of designing voltage level translating circuits which efficiently accomplish the required amplification has evaded a clear general solution. A large number of specialized circuits which are designed to accomplish the aforedescribed voltage level translation are found in the prior art. Most of them are functional but only marginally efficient, and are marginally adequate only for limited applications. In general, such MOS voltage level translation circuits have suffered from a number of shortcomings, including high DC power dissipation, very large input MOSFETs, and very slow speed, especially for DC type input buffers. Input buffers which are operable from a single clock input also have required a large amount of chip area, and have dissipated an unacceptably high amount of power. For bipolar input logic levels of less than 3 volts, operation has been marginal. Bipolar compatible input buffers for multi-phase MOS systems have required comparatively little chip area, but are inadequate for systems requiring fewer clock signals. For MOS random access memory systems it is desirable to have a minimum number of clocks in the system. However, for monolithic RAM chips several additional inputs are normally available, including a chip-enable input and a read-write input. Such signals may be advantageously utilized to simplify design of the address input buffers.

In summary, even though input buffer circuits, or voltage level translation circuits have been designed for various applications, serious compromises in the various aspects of circuit performance have been unavoidable prior to the present invention. The present invention as described herein overcomes the aforementioned shortcomings of the prior art input buffers as a result of the features of the invention.

SUMMARY OF THE INVENTION

Briefly described, the invention is an address input voltage level translator circuit especially suitable for use in a dynamic MOS random access memory (RAM). The voltage level translator operates from a single precharge clock signal and a generated complement thereof, which may be generated on the MOS RAM chip. The voltage level translator is capable of converting a low level TTL worst-case address input voltage of 2.4 volts to logic signals having adequate voltage levels for driving MOS decode gates on the RAM chip. The voltage level translator circuit includes a precharge bias switching circuit connected between the $V_{CC}$ supply and ground. The load MOSFET is connected to the precharge clock and the switch MOSFET is connected to the read clock, so that the output of the precharge stage is set to $V_{CC}$ volts. The output of the precharge circuit is connected to the gate electrode of an input transmission gate MOSFET having its source electrode connected to an address input terminal and its drain electrode connected to the gate electrode of the load MOSFET of the first clocked bootstrap amplifier. The gate bias voltage provided by the precharge bias circuit permits a voltage representative of a logical 1 level to be transferred from the address input terminal to the gate electrode (hereinafter also called a bootstrap node) of the load MOSFET of the first bootstrap amplifier. An enhancement capacitor which has its maximum capacitance when a 1 level is stored on the bootstrap node and further has its minimum capacitance when a 0 level is stored on said bootstrap node is connected between the gate and drain of the load MOSFET of the first bootstrap amplifier. The precharge clock complement signal is connected to the drain of the load MOSFET, so that if a 1 level is stored on the bootstrap node, it is capacitively boosted during the transition of the precharge clock complement signal due to coupling through the enhancement capacitor. However, if a 0 level is stored on the bootstrap node, the enhancement capacitor has a minimum value, and a negligible amount of bootstrapping action occurs during the transition of the precharge clock complement signal. The source of the load MOSFET is connected to an output terminal of the voltage level translator. Thus, because of the boosting of a 1 level on the bootstrap node during the trailing edge of the precharge clock complement signal, the stored gate voltage of the load MOSFETs thereof is boosted from approximately 2.4 volts to a substantially larger magnitude voltage by the bootstrap coupling action of the enhancement capacitance connected between the gate and drain of the load MOSFET. The previously mentioned read-write input signal is connected to the precharge bias circuit, and causes the transmission gate MOSFET to be turned off when a 1 level occurs on the read-write input terminal, thereby preventing the boosted voltage on the bootstrap node from gradually discharging to the address input terminal. The output of the first clock bootstrap amplifier circuit produces a signal logically equivalent to the address input voltage at an amplified voltage level suitable for MOS circuit operation. This output is connected to the input MOSFET of a clocked inverter, which is connected between ground and the $V_{DD}$ power supply. The load MOSFET thereof is clocked by the precharge clock signal, and the output of the clocked inverter is connected to the gate electrode of the load MOSFET of a second clocked bootstrap amplifier, which provides as its output a signal logically equivalent to the complement of the address input at voltage levels adequate to efficiently drive MOS decode gates. The second bootstrap amplifier stage is also clocked by the precharge clock complement signal. Thus, both address and address complement signals having voltage levels adequate for MOS circuits are generated by the voltage level translator according to the present invention. The outputs of both bootstrap amplifiers are caused to be discharged to ground by the precharge clock signal. Since the precharge clock signal does not overlap either the precharge clock complement signal or the read-write signal, the DC power dissipation of the voltage level translator is approximately zero.

In view of the foregoing, it is an object of this invention to provide an MOS voltage level translator circuit having nearly zero DC power dissipation for translating bipolar logic levels to MOS logic levels particularly suitable for use in integrated circuit MOS random access memory chips.

Another object of the invention is to provide an MOS voltage level translator circuit of the type described which provides both the address and address complement logic signals at suitable MOS voltage levels.

Another object of the invention is to provide an MOS voltage level translator of the type described wherein bootstrapping amplification by means of an enhanced capacitor having a capacitance which is a function of the input voltage level.

Another object of the invention is to provide an MOS input buffer of the type described having a first stage which provides a gate bias signal or level to a transmission gate MOSFET which permits transfer of a logical 1 level from the address input terminal to a bootstrap node, and further prevents subsequent discharging of the voltage on the bootstrap node after boosting thereof due to bootstrapping action or after a change in the address input voltage.

DESCRIPTION OF THE INVENTION

Figure 1:
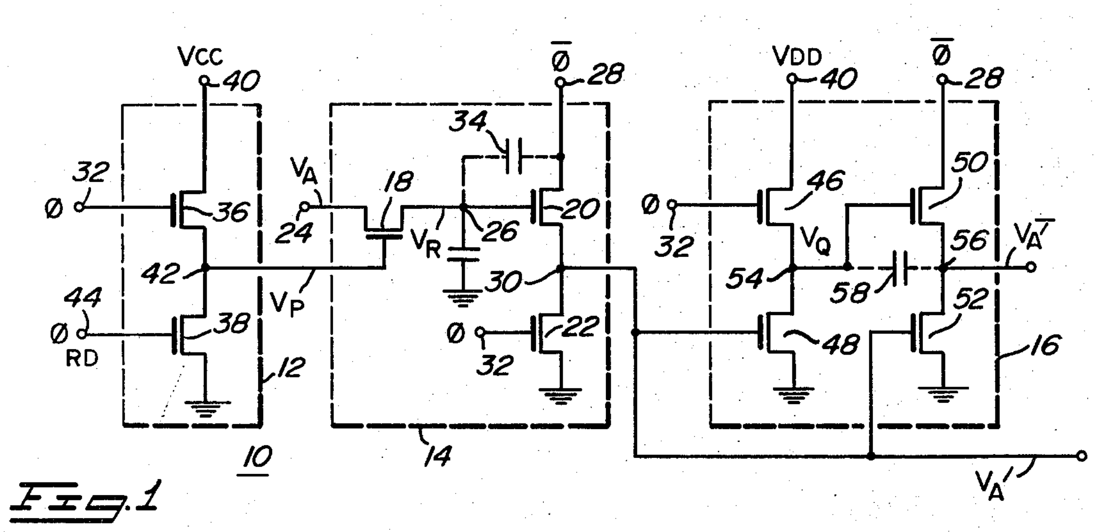
FIG. 1 is a schematic diagram of the preferred embodiment of the present invention.

Voltage level translator (also called an input buffer) 10 is schematically diagrammed in FIG. 1. Voltage level translator 10 includes switching bias circuit 12, first amplifier circuit 14, and second amplifier circuit 16. Amplifier circuit 14 includes transmission gate MOSFET 18, load MOSFET 20, and switch MOSFET 22. It should be noted that in the art the acroynm MOSFET is widely understood to include within the scope of its meaning all insulated gate field-effect transistors, and this is the intended meaning in the description of this invention. It should be recognized by those skilled in the art that a MOSFET may be of the P-channel type or the N-channel type. For the description of the operation of the circuit presented herein, it is assumed that N-channel MOSFETs are used. However, a P-channel implementation of the circuit is equally feasible. It is also well known that a MOSFET is a bilateral device having two main electrodes which may interchangeably function as source or drain electrodes, depending on which is at the more positive voltage. The convention adopted for the description herein is that the main electrodes will each be identified as either a source or a drain, although it is understood that during circuit operation an electrode identified as a source may function as a drain part of the time. The threshold voltage at which a MOSFET begins to turn on is designated hereafter as $V_{TH}$; it is well known that the threshold voltage $V_{TH}$ for a MOSFET increases as the reverse bias of the diode formed by the source of the MOSFET and the substrate is increased. Transmission gate MOSFET 18 has its source connected to input terminal 24; and address input logic signal on input terminal 24 may be a signal from a TTL address buffer. The drain of MOSFET 18 is connected to bootstrap node 26. Load MOSFET 20 has its gate connected to bootstrap node 26, and its drain connected to clock terminal 28, designated $\overline{\phi}$, and its source connected to node 30. The voltage on node 30 is $V_{A'}$. Switch MOSFET 22 has its drain connected to node 30, its gate connected to clock terminal 32, designated $\phi$, and its source connected to ground. An enhancement capacitor 34 has its gate electrode connected to bootstrap node 26 and its bulk electrode connected to the drain of load MOSFET 20. An enhancement capacitor is essentially an MOS device having only a source, but no drain. Its gate electrode serves as one of its parallel plates. If the voltage applied to the gate electrode between the gate and the source is approximately equal to or greater than the MOS threshold voltage $V_{TH}$, a channel is induced in the silicon under the gate insulator; the channel, of course, contacts the source region. The induced channel forms the other plate of the enhancement capacitor. However, if no channel is induced, the capacitance between the gate and the source, which are the two terminals, is nearly zero. Switching bias circuit 12 includes load MOSFET 36 and switch MOSFET 38. Load MOSFET 36 has its gate connected to $\phi$ (node 32), and its drain connected to voltage source 40, designated $V_{CC}$, and its source connected to node 42, which is the output of switching bias circuit 12. The gate of transmission gate MOSFET 18 is also connected to node 42. Switch MOSFET 38 has its drain connected to node 42, its gate connected to terminal 44, and its source connected to ground. Terminal 44 is connected to a signal designated $\phi_{RD}$, which may be a clock signal utilized during a read cycle. Amplifier circuit 16 includes load MOSFET 46 and switch MOSFET 48, which form an inverter and second bootstrap amplifier including load MOSFET 50 and switch MOSFET 52. MOSFET 48 has its source connected to ground, its gate connected to node 30, and its drain connected to node 54, which is the output of the inverter. Load MOSFET 46 has its drain connected to $V_{DD}$ (node 40), its gate connected to $\phi$ (node 32), and its source connected to node 54. The voltage on node 54 is designated $V_2$. Switch MOSFET 52 has its source connected to ground, its gate connected to node 30, and its drain connected to output node 56. The voltage on node 56 is designated $V_{\overline{A'}}$. Load MOSFET 50 has its drain connected to $\overline{\phi}$ clock input 28, its gate connected to bootstrap node 54, and its source connected to node 56.

Figure 2:
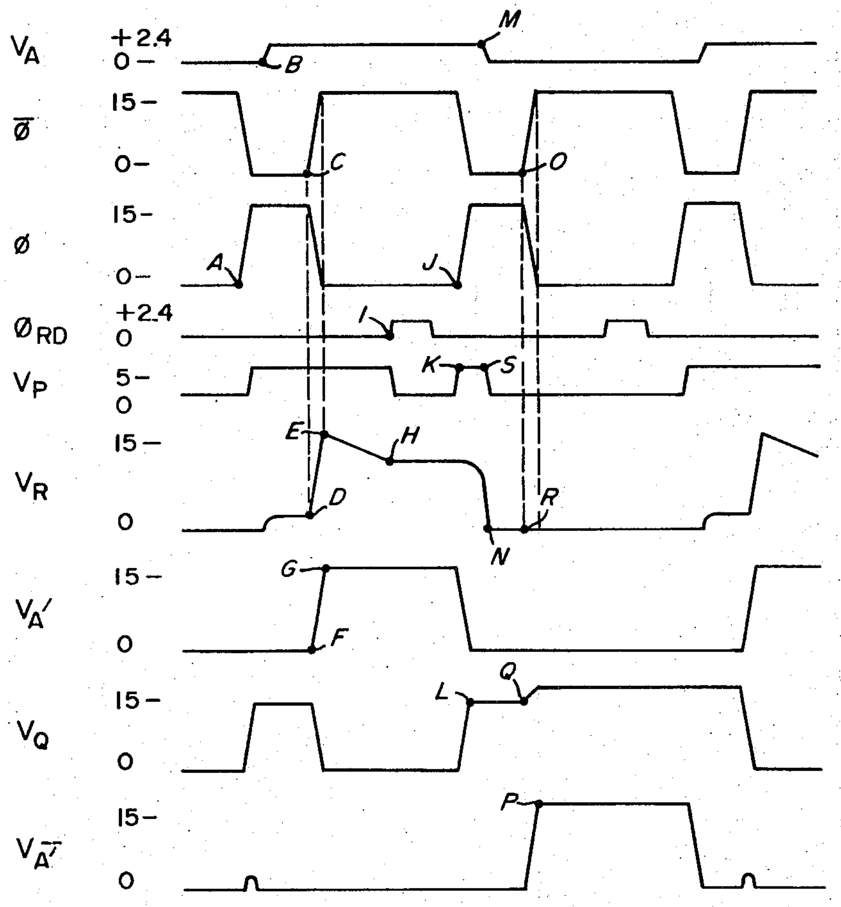
FIG. 2 is a timing diagram for the embodiment of the invention schematically diagrammed in FIG. 1.

The operation of the circuit schematically diagrammed in FIG. 1 is best understood with reference to the timing diagram shown in FIG. 2. Waveform $V_A$ in FIG. 2 is the logic input (which may be supplied from a TTL gate) applied to address input terminal 24, and may have a worst case 1 level as low as 2.4 volts. This is the logic level that is to be amplified by the circuit in FIG. 1 to provide output voltages $V_{A'}$ and $V_{\overline{A'}}$, which have a magnitude of approximately $V_{DD}$ volts.

For the purpose of explaining the present invention, $V_{DD}$ will be assumed to be +15 volts. The two clock input waveforms of $\phi$ and $\bar{\phi}$, as shown in FIG. 2 have logic swings from 0 to 15 volts. $\phi$ is referred to as a precharge clock; $\bar{\phi}$ is the complement of $\phi$. One of the two clock inputs $\phi$, or $\bar{\phi}$ may be generated on the memory chip. Another input to the level translator 10 is the read signal $\phi_{RD}$, also shown in FIG. 2. $V_P$ and $V_R$ are the voltages on nodes 42 and 26, respectively which are generated when signals $V_A$, $\bar{\phi}$, $\phi$ and $\phi_R$ occur as shown in FIG. 2. The resulting waveforms appearing on nodes 30, 54 and 56 are also shown, respectively as $V_{A''}$, $V_Q$ and $V_{\bar{A}}$ in FIG. 2. The power supply $V_{CC}$ applied to node 40 is assumed to be 5 volts for the description herein. It may be further assumed that the MOS threshold voltage $V_{TH}$ is between 1.4 volts and 2.4 volts. The first event shown in a timing diagram of FIG. 2 is the occurrence of a pulse on the $\phi_{RD}$ waveform. This insures that $V_P$ (node 42) is initially at ground. At point A on the waveform, $\bar{\phi}$ undergoes a transition from 0 volts to 15 volts. This causes $V_P$ (node 42) to be precharged up to $V_{CC}$ volts, (i.e., 5 volts) through MOSFET 36. $V_Q$ (node 54) is also precharged to approximately 12 volts through MOSFET 46. (It will be recognized by those skilled in the art that if $\phi$ and $V_{DD}$ are both equal to 15 volts, then $V_Q$ (node 54) will only be precharged to $(V_{DD} - V_{TH})$ volts). $V_A$ (node 30) will be discharged to 0 volts through MOSFET 22 if it is at any other voltage prior to the time at point A occurs. As $\phi$ undergoes its transition from 0 volts to 15 volts, $\bar{\phi}$ undergoes a transition from 15 volts to 0 volts. At the end of this transition, $\phi$ is at 15 volts, and $V_Q$ (node 54) is at approximately 12 volts, so MOSFET 50 is "on" and $V_{\bar{A}'}$ (node 56) is discharged to ground through MOSFET 50. Thus, prior to a transition of address input $V_A$, both $V_{A'}$ and $V_{\bar{A}'}$ are at ground potential. At point B on the $V_A$ waveform, $V_A$ undergoes a transition from 0 volts to 2.4 volts. This represents an address change. Since $V_P$ is equal to +5 volts (i.e., $V_{CC}$ volts) $V_R$ is charged up through MOSFET 18 to 2.4 volts, since MOSFET 18 is in the linear region of its operation. Thus the enhancement capacitance 34 between the drain and gate of MOSFET 20 is "turned on" since both node 30 and node 28 are at 0 volts. At point C the $\bar{\phi}$ waveform undergoes a transition from 0 to 15 volts. During this transition, $V_R$ is capacitively boosted to a greater magnitude voltage, due to the voltage division across enhancement capacitance 34 and stray capacitance 27. This increase of over 10 volts in $V_R$ is shown in FIG. 2 between points D and E on the $V_R$ waveform. This causes load MOSFET 20 to be turned on strongly, and $V_{A'}$ (node 30) follows $\bar{\phi}$, as shown in FIG. 2 between points F and G of the waveform of $V_A$. Thus, the stray capacitance on node 30 (not shown) is charged through MOSFET 20 to approximately +15 volts. Note that MOSFET 22 is off during this time, as is MOSFET 46. As $V_{A'}$ increases, switch MOSFET 48 turns on, and the precharged 12 volt level of $V_Q$ (on node 54) is rapidly discharged to ground, so that load MOSFET 50 is turned off. Thus, $V_{\bar{A}'}$ (node 56) remains at 0 volts during the abovementioned transition of $\bar{\phi}$. Once the transition of $\bar{\phi}$ is complete, node $V_R$ may tend to discharge somewhat through transmission gate MOSFET 18 to $V_A$ volts if $V_P$ is more than a threshold drop greater in magnitude than $V_A$. This partial discharge is shown between points E and H on the $V_R$ waveform in FIG. 2. At point I on the $\phi_{RD}$ waveform, node 44 increases from 0 to 2.4 volts, thereby turning MOSFET 38 on and discharging $V_P$ to ground, thereby turning transmission gate MOSFET 18 off. This prevents any further discharge of node 26 through MOSFET 18. The slope of the waveform of $V_R$ during the discharge between points E and H is proportional to the difference between the power supply voltage $V_{CC}$ and the sum of the address input voltage $V_A$ plus the MOS threshold voltage $V_{TH}$. Referring now to point J on the $\phi$ waveform, it is seen that $V_P$ is again precharged to +5 volts (point K), and $V_{A'}$ (node 30) is discharged through MOSFET 22 to 0 volts, and $V_Q$ (node 54) is precharged to within a threshold voltage drop of +15 volts (point L). When $V_A$ decreases from 2.4 volts to 0 volts at point M, $V_R$ is discharged to 0 volts through MOSFET 38 (point N). When $\bar{\phi}$ goes from 0 volts to 15 volts at point O, $V_{\bar{A}'}$ (node 56) follows $\phi$ since MOSFET 50 is on; see point P on the $V_{\bar{A}'}$ waveform. Due to the bootstrapping action of enhance capacitance 58, $V_Q$ is boosted somewhat during the transition of $V_{\bar{P}\bar{R}}$ from point O; (see point Q of the $V_Q$ waveform). The operation of the bootstrap driver circuit which includes MOSFETs 20 and 22 and the enhancement capacitance 34 is dependent on the non-linear characteristics of enhancement capacitance 34. The enhancement capacitance 34 has a value of approximately zero if $V_R$ is substantially less than the MOS threshold voltage $V_{TH}$; on the other hand, it has a maximum value if the voltage $V_R$ is greater than the MOS threshold voltage $V_{TH}$, (assuming that $\bar{\phi}$ is at ground). Thus, at point D of waveform of $V_{R'}$ bootstrapping of $V_R$ occurs and $V_R$ is increased by more than 10 volts, because enhancement capacitance 34 has its maximum value. However, at point R of the $V_R$ waveform, a negligible increase in $V_R$ occurs, because enhancement capacitance 34 is approximately zero.

Those skilled in the art will recognize that the enhancement capacitance 58 could instead be connected between the gate and drain of load MOSFET 50 to provide a faster rise time of the $V_{\bar{A}'}$ waveform. at the expense of decrease noise immunity. It will be further recognized by those skilled in the art that the switching bias circuit 12 in FIG. 1 may be modified to provide a bias voltage $V_P$ at node 42 which tracks with the MOS threshold voltage $V_{TH}$. For example, node 40 could be connected to a power supply integrated on the MOS memory chip which tracks with $V_{TH}$ in the desired manner, instead of being connected to an external constant voltage supply $V_{CC}$.

In summary, the present invention provides a voltage level translator suitable for use in many applications, especially in MOS dynamic RAMs. The level translator includes a clocked switching bias circuit which permits the address inputs to change immediately after the read clock pulse occurs. The DC power dissipation of the voltage level translator of the present invention is essentially zero. A single low level logic signal address input is required, and high voltage level address and address complement signals are generated.

While this invention has been shown in connection with a specific example, it will be readily apparent to those skilled in the art that various changes in form and arrangement of parts may be made to suit specific requirements without departing from the spirit and scope of the present invention.

What is claimed is:

1. A field-effect transistor voltage level translator circuit connected to first, second, and third voltage source means, input means for receiving an input logic signal, first clock input means for receiving a first clock signal, and second clock input means for receiving a second clock signal, for translating the input logic signal into an amplified equivalent output logic signal comprising:

a field-effect transmission gate connected to the input means, a first bootstrap node, and the third voltage source means; and a first bootstrap amplifier circuit connected to the first bootstrap node and a first output node and including a switch field-effect transistor connected to the first clock input means and a load field-effect transistor connected to the second clock input means for amplifying the magnitude of a logical "one" level stored on the first bootstrap node.

2. The field-effect transistor voltage level translator circuit as recited in claim 1 wherein said field-effect transistor transmission gate comprises a first field-effect transistor having its source connected to said input means, its gate connected to the third voltage source means, and its drain connected to the first bootstrap node.

3. The field-effect transistor voltage level translator circuit as recited in claim 1 wherein said first bootstrap amplifier circuit includes a second field-effect transistor and a third field-effect transistor, said second field-effect transistor having its gate connected to the first bootstrap node, its drain connected to the second clock input means, and its source connected to the output node, said third field-effect transistor having its source connected to the second voltage source means, its gate connected to the first clock signal, and its drain connected to the output node, wherein a logical "one" voltage level stored on the first bootstrap node is boosted by capacitive coupling of the gate-to-drain capacitance of said second field-effect transistor, thereby increasing the magnitude of the "one" level at the first output node.

4. The field-effect transistor voltage level translator circuit as recited in claim 3 and further including an enhanced capacitor having its gate electrode connected to the first bootstrap node and its bulk electrode connected to the drain of said second field-effect transistor.

5. The field-effect transistor voltage level translator circuit as recited in claim 1 wherein the second clock input means is the logical complement of the first clock signal.

6. The field-effect transistor voltage level translator circuit as recited in claim 2 wherein said third voltage source means includes a bias circuit for producing an intermediate voltage connected to the gate of said field-effect transistor transmission gate.

7. The field-effect transistor voltage level translator circuit as recited in claim 2 wherein said third voltage source means includes a switching bias circuit connected to the second voltage source means for controllably producing an intermediate voltage applied to the gate of said field-effect transistor transmission gate.

8. The field-effect transistor voltage level translator circuit as recited in claim 2 wherein said third voltage source means includes a bias circuit for producing an intermediate voltage which is a function of the field-effect transistor threshold voltage, said intermediate voltage being applied to the gate of said field-effect transistor transmission gate.

9. The field-effect transistor voltage level translator circuit as recited in claim 7 wherein said switching bias circuit comprises:

a third field-effect transistor having its drain connected to a third power supply, its gate connected to the first clock input means, and its source connected to the gate of said field-effect transistor transmission gate; and a fourth field-effect transistor having its drain connected to the gate of said field-effect transistor transmission gate, its gate connected to a third clock input means, and its source connected to the second voltage source means.

10. The field-effect transistor voltage level translator circuit as recited in claim 1 further including an inverter circuit connected to the first output node, and a second bootstrap amplifier circuit connected to a second bootstrap node and a second output node, for amplifying the magnitude of a logical "one" level stored on the second bootstrap node, wherein said inverter circuit include fifth and sixth field-effect transistors, said fifth field-effect transistor having its drain connected to the first voltage source means, its gate connected to the first clock input means, and its source connected to the second bootstrap node, said sixth field-effect transistor having its drain connected to the second bootstrap node, its gate connected to the second clock input means, and its source connected to the second voltage source means, and said second bootstrap amplifier circuit includes seventh and eighth field-effect transistors, said seventh field-effect transistor having its drain connected to the first voltage source means, its gate connected to the second bootstrap node, and its source connected to the second output node, said eighth field-effect transistor having its drain connected to the second output node, its gate connected to said first output node, and its source connected to the second voltage source means.

* * * * *